United States Patent
Inns

(10) Patent No.: US 8,962,459 B2
(45) Date of Patent: *Feb. 24, 2015

(54) DIFFUSION SOURCES FROM LIQUID PRECURSORS

(71) Applicant: Piquant Research LLC, Wilmington, DE (US)

(72) Inventor: Daniel Inns, Palo Alto, CA (US)

(73) Assignee: Piquant Research LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/179,790

(22) Filed: Feb. 13, 2014

(65) Prior Publication Data

US 2014/0162444 A1 Jun. 12, 2014

Related U.S. Application Data

(63) Continuation of application No. 12/873,320, filed on Sep. 1, 2010, now Pat. No. 8,669,169.

(51) Int. Cl.
| | |
|---|---|
| *H01L 21/265* | (2006.01) |
| *H01L 21/228* | (2006.01) |
| *H01L 21/22* | (2006.01) |
| *H01L 21/225* | (2006.01) |
| *H01L 31/068* | (2012.01) |
| *H01L 31/18* | (2006.01) |

(52) U.S. Cl.
CPC .......... *H01L 21/228* (2013.01); *H01L 21/2225* (2013.01); *H01L 21/2255* (2013.01); *H01L 31/068* (2013.01); *H01L 31/1804* (2013.01); *Y02E 10/547* (2013.01)
USPC ..... 438/522; 438/537; 438/542; 257/E21.491

(58) Field of Classification Search
USPC ........... 438/522, 537, 542, 563; 257/E21.491
See application file for complete search history.

(56) References Cited

U.S. PATENT DOCUMENTS

| | | | |
|---|---|---|---|
| 5,866,471 | A | 2/1999 | Beppu et al. |
| 6,527,847 | B1 | 3/2003 | Matsuki |
| 7,067,069 | B2 | 6/2006 | Shiho et al. |
| 8,669,169 | B2 * | 3/2014 | Inns .............................. 438/522 |
| 2007/0151598 | A1 | 7/2007 | De Ceuster et al. |
| 2008/0057220 | A1 | 3/2008 | Bachrach et al. |
| 2009/0020156 | A1 | 1/2009 | Ohtsuka et al. |
| 2009/0020829 | A1 | 1/2009 | Chandra et al. |
| 2010/0035422 | A1 | 2/2010 | Leung et al. |

* cited by examiner

*Primary Examiner* — Thanhha Pham

(57) ABSTRACT

A method selectively diffuses dopants into a substrate wafer. The method comprises blanket depositing a doped liquid precursor including dopants on a surface of the substrate wafer to create a doped film on the surface of the substrate wafer, selectively forming a diffusion source in the doped film to selectively diffuse the dopants into the substrate wafer, and heating the doped film on the substrate wafer, wherein said heating the doped film diffuses the dopants from the doped film into the substrate wafer.

13 Claims, 4 Drawing Sheets

DIFFUSION SOURCES FROM LIQUID PRECURSORS

RELATED APPLICATIONS

This application is a continuation of U.S. patent application Ser. No. 12/873,320, entitled "DIFFUSION SOURCES FROM LIQUID PRECURSORS," filed Sep. 1, 2009. The entire disclosure of the preceding application is incorporated herein by reference for all purposes.

BACKGROUND

The method disclosed herein, in general, relates to a process for doping the surface of a solar cell. More particularly, the method disclosed herein relates to a use of a doped film on the surface of the solar cell as a diffusion source.

Typical solar cells are made on p-type silicon wafers with n-type diffusion on a front surface to form a p-n junction. The diffused region is called an emitter, and is usually formed by phosphorus diffusion. The emitter is doped heavily in order to form one or more metal contacts as well as to obtain a low sheet resistance. Silver paste is typically used to provide a metal contact. The silver paste penetrates into the emitter when the silicon wafer is heat treated. Doping of the emitter region needs to be thick to contain the silver within the emitter region and not allow the silver to penetrate into a depletion region or a p-type region. The practical requirements of the heavy phosphorous doping in the emitter region suffer from drawbacks, for example, high surface recombination, high emitter dark current, poor lifetime of the emitter region, and poor spectral response for light absorbed in or near the emitter. Typical solar cells produced in this manner have efficiencies of about fourteen percent.

Hence, there is a long felt need for selective heavy doping of the emitter region under the metal contacts to obtain low contact resistance for the metal and to repel minority carriers from the metal contacts. There is also a need for selective light doping on the rest of the emitter region to achieve low surface recombination, low emitter dark current, higher lifetime of the emitter region, and an improved spectral response for light absorbed in the emitter region. There is this need for dual doping of a silicon wafer for increasing the efficiency of the silicon solar cells. There is also a need for selective heavy doping to form high-low junctions on the back of the semiconductor device, also referred to as back surface fields, or back contact regions on silicon solar cells.

SUMMARY

This summary is provided to introduce a selection of concepts in a simplified form that are further described in the detailed description of the invention. This summary is not intended to identify key or essential inventive concepts of the claimed subject matter, nor is it intended for determining the scope of the claimed subject matter.

The methods disclosed herein address the above stated need for dual doping of a substrate wafer for increasing the efficiency of a solar cell. The dual doping comprises selective heavy doping of an emitter region under metal or metal contacts and selective light doping on the rest of the emitter region. The selective heavy doping of the emitter region under the metal or metal contacts produces a low contact resistance for the metal and repels minority carriers from the metal contacts. The selective light doping on the rest of the emitter region achieves low surface recombination, low emitter dark current, higher lifetime of the emitter region, and an improved spectral response for the light absorbed in the emitter region. The methods disclosed herein also enable selective heavy doping on the substrate wafer.

A method for selectively diffusing dopants into a substrate wafer is provided herein. In the method disclosed herein, a liquid precursor is doped with dopants. The dopants are, for example, p-type impurities or n-type impurities. The liquid precursor is selected from a group comprising monomers, polymers, and oligomers of silicon and hydrogen. The liquid precursor is, for example, one or more of a silane, an oligosilane, and a polysilane, with one or more of linear, branched and particulate structures. The doped liquid precursor is deposited on a surface of the substrate wafer to create a doped film on the surface of the substrate wafer. The deposition of the doped liquid precursor is performed, for example, by one or more of ink-jet printing, screen printing, condensing, pneumatic spraying, ultrasonic spraying, electrospraying, spraying by liquid ejection from an orifice, spraying by direct injection of droplets of the doped liquid precursor impinging on the substrate wafer, spin coating, roller coating, bar coating, curtain coating, dip coating, bar coating, etc.

The doped film is heated on the substrate wafer. The heating of the doped film diffuses the dopants from the doped film into the substrate wafer. Regions of the doped film can be oxidized and used as a diffusion source. Oxidized and non-oxidized regions of the doped film can be used simultaneously as diffusion sources to obtain different sheet resistances. Diffusion of the dopants from the doped film into the substrate wafer comprises simultaneous creation of heavily diffused regions and lightly diffused regions in the substrate wafer based on different diffusion rates. In an embodiment, a lightly diffused region is created in the substrate wafer prior to or after the deposition of the doped liquid precursor.

In an embodiment, the doped liquid precursor is selectively deposited on the surface of the substrate wafer for creating patterns of the doped film on the surface of the substrate wafer, thereby creating a patterned diffusion source on the surface of the substrate wafer. The created patterns of the doped film on the surface of the substrate wafer enable selective diffusion of the dopants into the substrate wafer after the heating of the doped film. Therefore, the liquid precursor may be deposited on selected areas or on the full area of the substrate wafer.

In another embodiment, the doped film is selectively cured on the surface of the substrate wafer. The selectively cured doped film acts as a selected area diffusion source for selectively diffusing the dopants into the substrate wafer. The doped film is selectively cured, for example, by patterned irradiation. The selectively cured doped film is heated to diffuse the dopants from the selectively cured doped film into the substrate wafer. On heating, the selectively cured doped film on the substrate wafer is converted into silicon compounds, for example, silicon polymer, amorphous silicon, polycrystalline silicon, or a mixture of these phases. In another embodiment, the selectively cured doped film is selectively oxidized on the surface of the substrate wafer. The selectively oxidized doped film is heated on the substrate wafer for selectively diffusing the dopants from the selectively oxidized doped film into the substrate wafer.

In another embodiment, the doped film is selectively cured on the surface of the substrate wafer to create cured regions and uncured regions of the doped film on the surface of the substrate wafer. The uncured regions on the surface of the substrate wafer are oxidized to obtain non-oxidized cured regions and oxidized uncured regions of the doped film on the surface of the substrate wafer. The non-oxidized cured regions and the oxidized uncured regions of the doped film are then heated. The dopants diffuse from the non-oxidized cured regions and the oxidized uncured regions of the doped film into the substrate wafer at different diffusion rates to produce differentiated sheet resistances on the surface of the substrate wafer. In an embodiment, the oxidized uncured regions of the doped film are etched from the surface of the substrate wafer, which removes the dopants and prevents diffusion from the oxidized uncured regions.

Disclosed herein is also a use of a doped film as a diffusion source for selectively diffusing dopants into a substrate wafer. The doped film is created by depositing a doped liquid precursor on a surface of the substrate wafer. The doped film is selectively cured on the surface of the substrate wafer and heated for selectively diffusing the dopants from the doped film into selective areas of the substrate wafer where metal contacts are intended to be deposited.

Disclosed herein is also a method for manufacturing a solar cell. A liquid precursor doped with dopants is deposited on a surface of a substrate wafer to create a doped film on the surface of the substrate wafer. The doped film is selectively cured on the surface of the substrate wafer to create cured regions and uncured regions of the doped film. The uncured regions of the doped film are oxidized and etched from the surface of the substrate wafer. The cured regions of the doped film are heated on the surface of the substrate wafer for diffusing the dopants into the substrate wafer to create a heavily diffused region in the substrate wafer. A secondary light diffusion is performed to obtain a low sheet resistance emitter. A silicon nitride layer is deposited on the substrate wafer. A metal contact, for example, a silver paste is deposited on the deposited silicon nitride layer aligned to the region where the doped polysilane film is deposited. During heating, the metal contact penetrates the silicon nitride layer to contact the heavily diffused region, thereby manufacturing the solar cell. The created heavily diffused region and the lightly diffused region define one or more diffused emitter regions on the surface of the substrate wafer.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific components and methods disclosed herein.

DETAILED DESCRIPTION

Figure 1:
FIG. 1 exemplarily illustrates a doped liquid precursor deposited on a surface of a substrate wafer to create a doped film.

Disclosed herein is a method for selectively diffusing dopants into a substrate wafer. In the method disclosed herein, a liquid precursor is doped with dopants. The doped liquid precursor is deposited on a surface of the substrate wafer to create a doped film on the surface of the substrate wafer. The doped film is then heated on the substrate wafer to diffuse the dopants from the doped film into the substrate wafer. In an embodiment, a lightly diffused region is created in the substrate wafer prior to the deposition of the doped liquid precursor. In another embodiment, a lightly diffused region is created in the substrate wafer after the deposition of the doped liquid precursor and the heavy dopant diffusion step. In another embodiment, oxidized and non-oxidized regions of the doped film are used as simultaneous diffusion sources to create two different sheet resistances.

In an embodiment, the doped film is selectively cured on the surface of the substrate wafer. Curing of the doped film is performed, for example, using ultraviolet (UV) radiation. The selectively cured doped film acts as a diffusion source for selectively diffusing the dopants into the substrate wafer.

In another embodiment, the uncured regions of the selectively cured doped film are oxidized on the surface of the substrate wafer. Oxidizing the selectively cured doped film refers to exposing the selectively cured doped film to oxygen or moisture. The selectively oxidized doped film on the substrate wafer is then heated for selectively diffusing the dopants from the selectively oxidized doped film into the substrate wafer.

In an embodiment, the doped liquid precursor is selectively deposited on the surface of the substrate wafer for creating patterns of the doped film on the surface of the substrate wafer. The created patterns of the doped film on the surface of the substrate wafer enable selective diffusion of the dopants into the substrate wafer after heating the doped film. As used herein, the term "selective diffusion" of the dopants into the substrate wafer refers to the diffusion of the dopants in selective regions of the substrate wafer at different diffusion rates.

In another embodiment, the doped film is selectively cured on the surface of the substrate wafer to create cured regions and uncured regions of the doped film on the surface of the substrate wafer. The cured regions are very stable, while the uncured regions of the doped film can be oxidized to create non-oxidized cured regions and oxidized uncured regions of the doped film on the surface of the substrate wafer. The non-oxidized cured regions and the oxidized uncured regions of the doped film are then heated. The dopants diffuse from the non-oxidized cured regions and the oxidized uncured regions of the doped film into the substrate wafer at different diffusion rates after heating to produce differentiated sheet resistances on the surface of the substrate wafer. In an embodiment, the oxidized uncured regions of the doped film are etched from the surface of the substrate wafer before a diffusion annealing process, which removes the dopants and prevents diffusion of the dopants from the oxidized uncured regions into the substrate wafer.

FIG. 1 exemplarily illustrates a doped liquid precursor deposited on a surface 101a of a substrate wafer 101 to create a doped film 102. Where the liquid precursor is a polysilane, the doped polysilane liquid precursor deposited on the surface 101a of the substrate wafer 101 creates a doped polysilane film 102. A doped liquid precursor, for example, a doped polysilane liquid precursor after deposition on the surface 101a of the substrate wafer 101 is hereafter referred to as a "doped polysilane film" and is no longer a precursor. The substrate wafer 101 is, for example, a silicon wafer. A method for selectively diffusing dopants into the substrate wafer 101 is provided herein. In the method disclosed herein, a liquid precursor is doped with dopants. The liquid precursor is selected from a group comprising monomers, polymers, and oligomers of silicon and hydrogen. The liquid precursor is, for example, a silane, an oligosilane and a polysilane, with linear, branched and particulate structures. The liquid precursors utilized herein comprise, for example, cyclic silanes such as cyclohexasilane, cyclopentasilane, and cycloheptasilane. Oligomers and polymers derived from the above mentioned silanes can also be used. Silanes comprising halogen, for example, chlorine may also be used. The liquid precursors are doped with dopants, for example, phosphorus, boron, etc. The dopants are, for example, p-type impurities or n-type impurities.

Liquid precursors, for example, polysilanes are liquid at room temperature, and are photosensitive. For purposes of illustration, the detailed description refers to a polysilane film 102; however the scope of the methods disclosed herein is not limited to the polysilane film 102 but may be extended to include films of multiple compositions of silicon based liquid precursors such as silanes, oligosilanes, etc. As polysilanes are liquid at room temperature, the deposition of the polysilane film 102 is performed, for example, by one or more of ink-jet printing, screen printing, condensing, pneumatic spraying, ultrasonic spraying, electrospraying, spraying by liquid ejection from an orifice, spraying by direct injection of droplets of the doped liquid precursor impinging on the substrate wafer 101, spin coating, roller coating, bar coating, curtain coating, dip coating, bar coating, etc.

Figure 2:
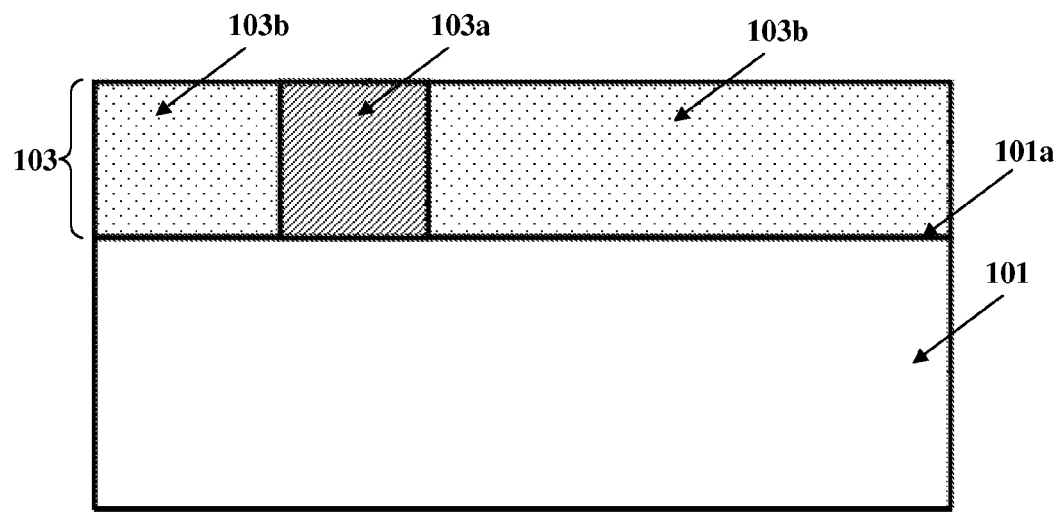
FIG. 2 exemplarily illustrates a selectively cured doped polysilane film on the surface of the substrate wafer.

The doped polysilane film 102 deposited on the surface 101a of the substrate wafer 101 is selectively cured, for example, by heat, light or a radiation process to diffuse dopants into the substrate wafer 101 below to selectively diffuse the dopants into the substrate wafer 101. FIG. 2 exemplarily illustrates a selectively cured doped polysilane film 103 on the surface 101a of the substrate wafer 101. The deposited doped polysilane film 102 is selectively cured on the surface 101a of the substrate wafer 101, for example, by patterned illumination with ultraviolet light or laser on the polysilane film 102 to, for example, a more stable polymer, an amorphous silicon, etc. The selectively cured doped polysilane film 103 comprises cured regions 103a and uncured regions 103b.

The deposited doped polysilane film 102 is cured by heat, ultraviolet (UV) light or irradiation. In an embodiment, the deposited doped polysilane film 102 is selectively cured by patterned irradiation using, for example, ultraviolet radiation. The exposure to ultraviolet (UV) light and/or heating of the polysilane film 102 can be restricted to local areas on the polysilane film 102 by using, for example, shadow masks as in lithography, lasers, etc. The polysilane films 102 are pyrophoric due to their high reactivity with oxygen and moisture. The photosensitive and heat sensitive properties of the liquid precursors allow the polysilane film 102 to be patterned and manipulated. During curing, the chemical bonds, for example the silicon-silicon bonds and silicon-hydrogen bonds in the liquid precursors' cross-link, a conversion resulting in a higher molecular weight polysilane polymer or amorphous silicon. After curing, the higher molecular weight polysilane polymer film is stable in air.

Figure 3:
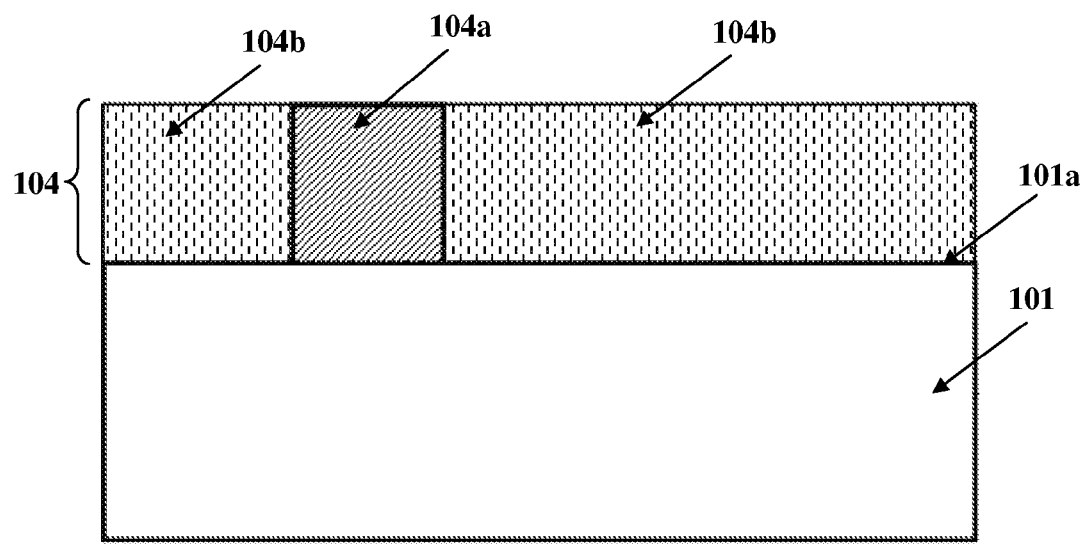
FIG. 3 exemplarily illustrates a selectively oxidized doped polysilane film on the surface of the substrate wafer.

FIG. 3 exemplarily illustrates a selectively oxidized doped polysilane film 104 on the surface 101a of the substrate wafer 101. The selectively cured doped polysilane film 103, illustrated in FIG. 2, is selectively oxidized to obtain the selectively oxidized doped polysilane film 104 exemplarily illustrated in FIG. 3. The selectively oxidized doped polysilane film 104 comprises non-oxidized cured regions 104a and oxidized uncured regions 104b. The selectively oxidized doped polysilane film 104 is heated on the substrate wafer 101 for selectively diffusing the dopants from the selectively oxidized doped polysilane film 104 into the substrate wafer 101. The diffusion of the dopants into the substrate wafer 101 selectively dopes the substrate wafer 101.

Figure 4:
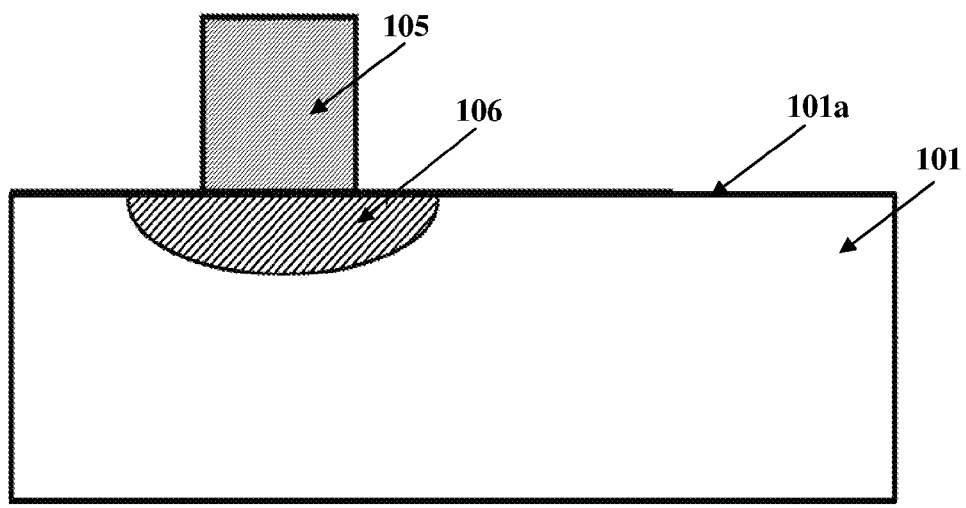
FIG. 4 exemplarily illustrates diffusion of dopants into the substrate wafer and formation of a crystallized polysilane film.

FIG. 4 exemplarily illustrates diffusion of dopants into the substrate wafer 101 and formation of a crystallized polysilane film 105. The selectively cured doped polysilane film 103, exemplarily illustrated in FIG. 2, is selectively oxidized to create the oxidized uncured regions 104b and the non-oxidized cured region 104a of the selectively oxidized doped polysilane film 104 as exemplarily illustrated in FIG. 3. The oxidized uncured regions 104b are etched and removed from the surface 101a of the substrate wafer 101. The substrate wafer 101 with the non-oxidized cured region 104a is then heated to diffuse the dopants into the substrate wafer 101 to create a local heavily diffused region 106. Heating to diffusion temperatures converts the non-oxidized cured region 104a of the selectively oxidized doped polysilane film 104 into polycrystalline silicon 105.

As exemplarily illustrated in FIG. 3, the selectively cured doped polysilane film 103 acts as a diffusion source for diffusing the dopants into the substrate wafer 101. In an embodiment, the doped polysilane film 102 is selectively deposited on the surface 101a of the substrate wafer 101 for creating patterns of the doped polysilane film 102 on the surface 101a of the substrate wafer 101. The created patterns of the doped polysilane film 102 on the surface 101a of the substrate wafer 101 enable selective diffusion of the dopants into the substrate wafer 101 after curing and heating of the created patterns of the doped polysilane film 102.

During heat treatment of the doped polysilane film 102, for example, at temperatures above 600° C., the dopants from the doped polysilane film 102 diffuse out of the doped polysilane film 102 and dope the substrate wafer 101 below. FIG. 4 illustrates a structure for a solar cell where the non-oxidized cured region 104a from FIG. 3 is used as a local diffusion source to create a heavily diffused region 106 below the non-oxidized cured region 104a. On heat treatment of the selectively oxidized doped polysilane film 104 on the substrate wafer 101, the dopants from the non-oxidized cured region 104a in FIG. 3 diffuse into the substrate wafer 101 to create the heavily diffused region 106 in the substrate wafer 101, and the non-oxidized cured region 104a changes phase into a crystallized polysilane film 105. The heavily diffused region 106 defines, for example, the heavily doped part of the emitter region of the solar cell. The diffusion process is, in general, a high thermal process, requiring long times and high temperatures. Depending on the type of dopants, temperatures around 900° C. are typically used to drive the diffusion process. The heat treating time is also dopant dependent, but is often longer than thirty minutes.

Figure 5:
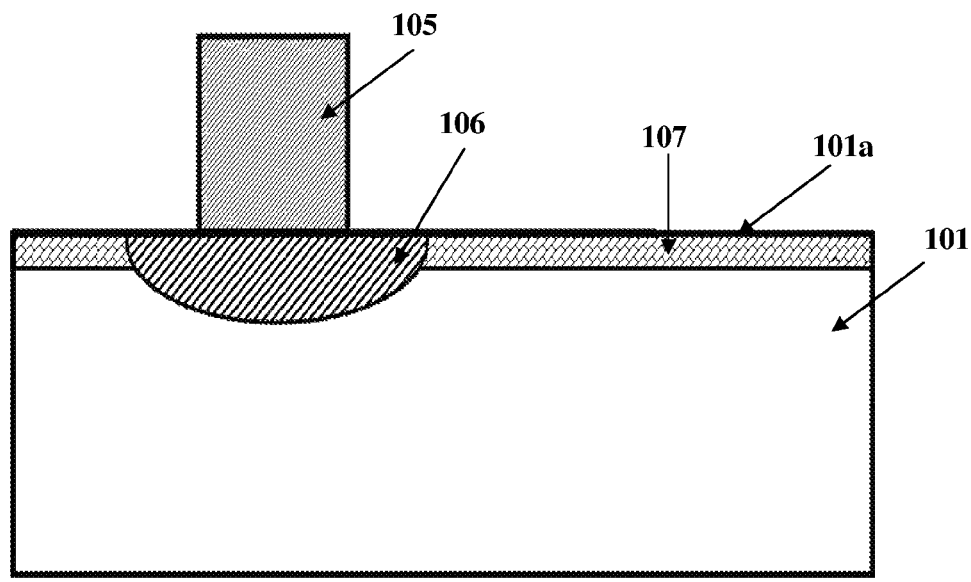
FIG. 5 exemplarily illustrates a substrate wafer comprising a lightly diffused region created by performing a second light diffusion step for making a continuous emitter.

FIG. 5 exemplarily illustrates a substrate wafer 101 comprising a lightly diffused region 107 created by performing a second light diffusion step for making a continuous emitter. The doped polysilane film 102 as exemplarily illustrated in FIG. 1 is deposited on a silicon surface 101a of the substrate wafer 101 that has been previously doped by another method, for example, an ion implant, doped epitaxial growth, alternate surface diffusion from a phosphoric acid, phosphorus chloride oxide vapor, etc., to form a lightly diffused region 107 as exemplarily illustrated in FIG. 5. In two embodiments, the silicon surface doping to form the lightly diffused region 107 is performed before or after the doped polysilane film 102 deposition. In an embodiment, heating the selectively oxidized doped polysilane film 104 on the substrate wafer 101 simultaneously creates the heavily diffused region 106 and the lightly diffused region 107 in the substrate wafer 101. The diffusion process is performed at high temperature and generally crystallizes the doped polysilane film 102 to form the crystallized polysilane 105. The doped polysilane film 102 crystallizes depending on the composition of the doped polysilane film 102 and the surface topography of the doped polysilane film 102, and whether an interface layer is present. Typically, the surface 101a of the substrate wafer 101 has a thin native or chemical oxide present.

The diffusion process is performed in an inert atmosphere such as argon or nitrogen, or in an oxygen-rich environment. The diffusion process is performed, for example, in a belt furnace or a quartz tube furnace. The diffusion process can also be performed in a rapid thermal annealing system using short times but potentially higher temperatures.

Figure 6:
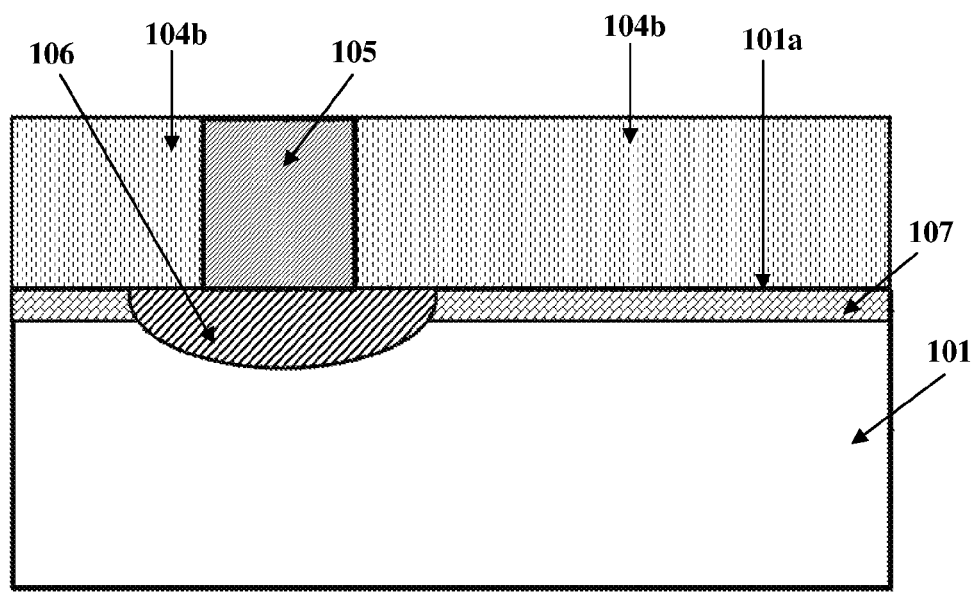
FIG. 6 exemplarily illustrates use of a non-oxidized cured region and oxidized uncured regions of the selectively oxidized doped polysilane film as simultaneous diffusion sources.

FIG. 6 exemplarily illustrates use of a non-oxidized cured region 104a and oxidized uncured regions 104b of the selectively oxidized doped polysilane film 104 illustrated in FIG. 3, as simultaneous diffusion sources. The doped polysilane film 102 is deposited on a surface 101a of a substrate wafer 101 as exemplarily illustrated in FIG. 1. As exemplarily illustrated in FIG. 2, the deposited doped polysilane film 102 is selectively cured on the surface 101a of the substrate wafer 101 to create a selectively cured doped polysilane film 103 comprising cured regions 103a and uncured regions 103b. The selectively cured doped polysilane film 103 is selectively oxidized to obtain the selectively oxidized doped polysilane film 104 comprising the non-oxidized cured region 104a and the oxidized uncured regions 104b as exemplarily illustrated in FIG. 3. The selectively oxidized doped polysilane film 104 on the substrate wafer 101 is then heated, for example, in a tube furnace to diffuse the dopants from the non-oxidized cured region 104a and the oxidized uncured regions 104b into the substrate wafer 101 to create a heavily diffused region 106 and a lightly diffused region 107 as exemplarily illustrated in FIG. 6. The heated non-oxidized cured region 104a and oxidized uncured regions 104b act as diffusion sources for diffusing the dopants into the substrate wafer 101 at different diffusion rates. The diffusion of the dopants into the substrate wafer 101 at different diffusion rates produces differentiated sheet resistances on the surface 101a of the substrate wafer 101. The heavily diffused region 106 has a sheet resistance much lower than the lightly diffused region 107. The diffusion process is performed at high temperature, and generally crystallizes the non-oxidized cured region 104a to form the crystallized polysilane film 105.

If the curing of the doped polysilane film 102 is incomplete, the incompletely cured doped polysilane film is unstable. When the incompletely cured doped polysilane film is exposed to normal ambient environments, the incompletely cured doped polysilane film oxidizes slowly to become a silicon oxide film. The incompletely cured doped polysilane film can be oxidized by air or other oxygen environments or water to form the selectively oxidized doped polysilane film 104 comprising oxidized uncured regions 104b. The silicon oxide film can be removed by a silicon oxide etchant, for example, hydrofluoric acid, etc. The doped polysilane film 102, amorphous silicon or the silicon oxides containing the dopants can then be used as diffusion sources for doping the substrate wafer 101.

In an embodiment, the incompletely cured doped polysilane film need not be removed from the substrate wafer 101 before the high temperature diffusion process. The cured regions 103a and the uncured regions 103b as exemplarily illustrated in FIG. 2 of the selectively cured doped polysilane film 103 diffuse out dopants into the substrate wafer 101 at different rates resulting in different sheet resistances across the substrate wafer 101 to produce a selective emitter structure as exemplarily illustrated in FIG. 6.

Figure 7:
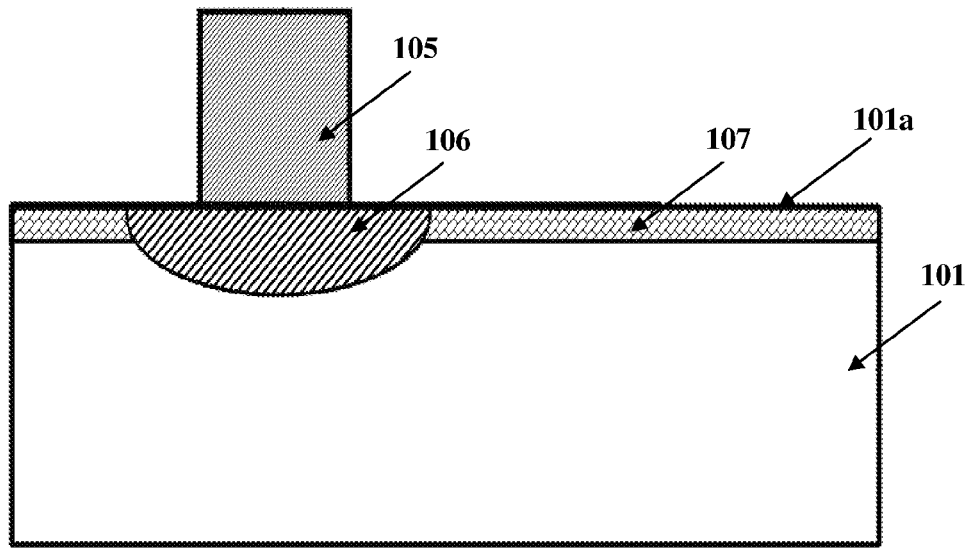
FIG. 7 exemplarily illustrates a substrate wafer after simultaneous diffusion from a non-oxidized cured region and oxidized uncured regions of the selectively oxidized doped polysilane film, with the oxidized uncured regions removed after the diffusion process.

FIG. 7 exemplarily illustrates a substrate wafer 101 after simultaneous diffusion from a non-oxidized cured region 104a and oxidized uncured regions 104b of the selectively oxidized doped polysilane film 104, with the oxidized uncured regions 104b removed after the diffusion process. The diffusion process performed at high temperature crystallizes the selectively oxidized doped polysilane film 104 to form the crystallized polysilane film 105. The diffusion process creates the heavily diffused region 106 and the lightly diffused region 107. The oxidized uncured regions 104b of the selectively oxidized doped polysilane film 104 are etched from the surface 101a of the substrate wafer 101. Selectively oxidized doped polysilane films 104 are etched by a range of chemistries, as the selectively oxidized doped polysilane films 104 are not very dense. Wet chemicals that etch silicon and its oxides, for example, hydrofluoric acid, ammonium hydroxide, potassium hydroxide, etc. can be used to etch the polysilane films 102 and oxidized uncured regions 104b of the selectively oxidized doped polysilane films 104. Most etches have high selectivity between the oxidized polysilane, non-oxidized polysilane, amorphous silicon, and crystalline silicon. If the oxidized uncured regions 104b of the selectively oxidized doped polysilane film 104 are removed after the diffusion process, the resulting structure is as exemplarily illustrated in FIG. 7. The structure illustrated in FIG. 7 is identical to the structure illustrated in FIG. 5, thus the same selective emitter structure can be achieved by two different process flows.

Figure 8:
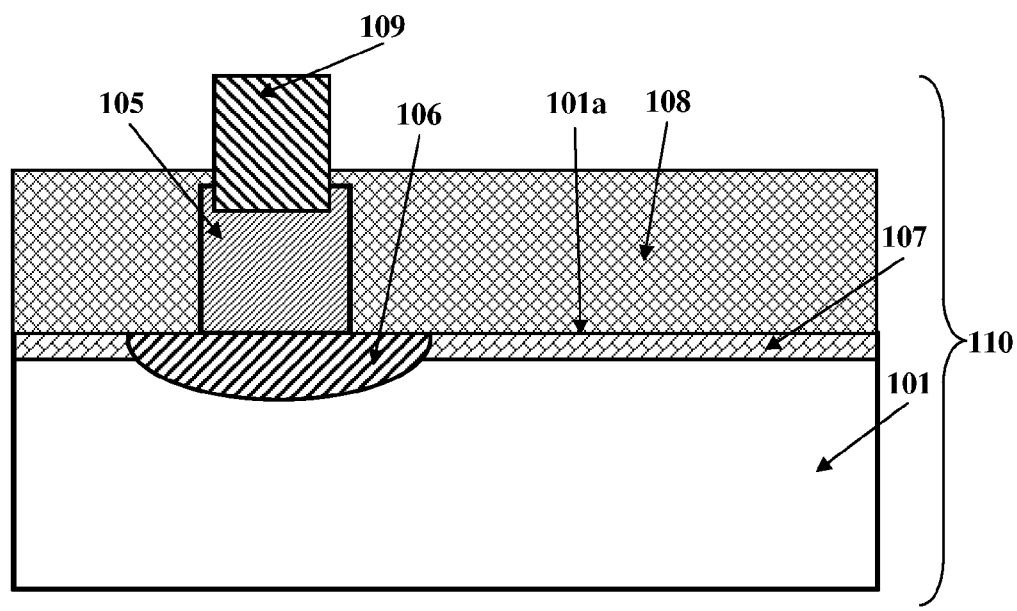
FIG. 8 exemplarily illustrates a solar cell structure manufactured using the method disclosed herein.

FIG. 8 exemplarily illustrates a solar cell structure manufactured using the method disclosed herein. Disclosed herein is a method for manufacturing a solar cell. A liquid precursor, for example, a polysilane liquid, is doped with dopants. The doped liquid polysilane precursor is deposited on a surface 101a of a substrate wafer 101 to create a doped polysilane film 102 on the surface 101a of the substrate wafer 101 as exemplarily illustrated in FIG. 1. The doped polysilane film 102 is selectively cured on the surface 101a of the substrate wafer 101 to create cured regions 103a and uncured regions 103b of the selectively cured doped polysilane film 103 on the surface 101a of the substrate wafer 101 as exemplarily illustrated in FIG. 2. The uncured regions 103b of the selectively cured doped polysilane film 103 are oxidized to create a selectively oxidized doped polysilane film 104 comprising oxidized uncured regions 104b as exemplarily illustrated in FIG. 3. The oxidized uncured regions 104b of the selectively oxidized doped polysilane film 104 are etched from the surface 101a of the substrate wafer 101. The substrate wafer 101 with the non-oxidized cured region 104a of the selectively oxidized doped polysilane film 104 is heated for diffusing the dopants into the substrate wafer 101 to create a heavily diffused region 106 in the substrate wafer 101. After the diffusion process, a second diffusion step is performed to create a lightly diffused region 107, for example, a lightly doped emitter region in the substrate wafer 101. A silicon nitride (SiN) layer 108 is deposited on the substrate wafer 101, covering all emitter regions and the doped polysilane film 102 which has crystallized to form the crystallized polysilane film 105. The silicon nitride layer 108 is deposited, for example, by plasma-enhanced chemical vapor deposition. The silicon nitride layer 108 passivates the upper surface 101a of the substrate wafer 101 and acts as an anti-reflection coating. A metal contact 109, for example, a silver paste is deposited on the deposited silicon nitride layer 108 on the surface 101a of the substrate wafer 101 by screen printing to create a layered structure 110. On heating the layered structure 110, the metal contact 109 penetrates the silicon nitride layer 108 to contact the crystallized polysilane film 105 or the heavily diffused region 106 to make the solar cell. The heavily diffused region 106 and the lightly diffused region 107 define one or more selective emitter regions on the surface 101a of the substrate wafer 101. If there is a heavily diffused region 106, for example, a selective emitter with heavy contact doping, the metal contact 109 is aligned to the heavily diffused region 106. The structure produced using the polysilane film 102 as the heavy diffusion source is exemplarily illustrated in FIG. 8.

Typically, solar cells use heavy doping under the metal contacts 109. The doped polysilane film 102 formed from the liquid precursor acts as a diffusion source for diffusing the dopants into the substrate wafer 101. The polysilane film 102 is cured to an air stable film by treatment with heat and/or light or both. Thus, the polysilane film 102 is patterned using, for example, ultraviolet light, a shadow mask process, or a locally focused laser, etc. The liquid precursor can also be deposited locally by a printing process, and then cured. After curing, the polysilane film 102 converts to a different form of polysilane or amorphous silicon. The incompletely cured doped polysilane film can be oxidized at room temperature in air, or can be oxidized at a higher temperature or in a moisture-rich or oxygen rich environment. The selectively oxidized doped polysilane film 104 is used for subsequent processing, or can be removed by etching. A high temperature process, for example, rapid thermal annealing (RTA) or furnace anneal is used to diffuse dopants from the doped polysilane film 102 into the substrate wafer 101, creating a local heavily diffused region 106 in the substrate wafer 101.

The polysilane film 102 as exemplarily illustrated in FIG. 1 can be deposited in selected areas of the substrate wafer 101 to produce diffusions in selected regions of the substrate wafer 101 during thermal processing. The light and heat sensitivity of the polysilane film 102 allow the polysilane film 102 to be readily patterned. The polysilane film 102 can be locally exposed to, for example, ultraviolet light similar to photolithography exposure process, an ultraviolet laser, or another laser which can heat the polysilane film 102 directly or by conductance from the heated adjacent layer.

Consider an example of manufacturing a silicon solar cell. A substrate wafer 101, for example, a lightly doped p-type silicon wafer 101 is cleaned by immersion in a piranha solution. A piranha solution is, for example, about a one part hydrogen peroxide mixed with one part of sulfuric acid. The lightly doped p-type silicon wafer 101 is rinsed to remove chemical residues. The lightly doped p-type silicon wafer 101 is then hydrofluoric (HF) acid etched to remove the surface oxide. The lightly doped p-type silicon wafer 101 is rinsed again and then a metals removal clean is performed in a mixture or water, hydrogen peroxide, and hydrochloric acid with a mixture ratio of about 5:1:1 respectively. The clean lightly doped p-type silicon wafer 101 is then loaded into an inert ambient environment. A liquid precursor is prepared by a mixture of about two parts toluene and one part cyclopentasilane, with enough phosphorus tribromide solution added to give the liquid a silicon:phosphorus atomic ratio of about 50:1. This is an equivalent phosphorus doping level of approximately $1 \times 10^{21}$ cm$^{-3}$ in silicon. Using a K-bar coater the liquid precursor is coated onto the surface 101a of the lightly doped p-type silicon wafer 101 to form a doped polysilane film 102 with a thickness of about 250 nanometers. A shadow mask is then placed over the lightly doped p-type silicon wafer 101 and an ultraviolet-A/ultraviolet-B combined spectrum lamp light is directed onto the surface 101a of the lightly doped p-type silicon wafer 101, curing local areas of the doped polysilane film 102 on the surface 101a of the lightly doped p-type silicon wafer 101. Areas shaded by the mask are not cured. The ultra violet radiation dose is less than 1 Joule per cm squared. The lightly doped p-type silicon wafer 101 can then be exposed to air at room temperature to oxidize the uncured region 103b of the lightly doped p-type silicon wafer 101, which can then be removed by etching in approximately 4.9% hydrofluoric acid for about two minutes. The lightly doped p-type silicon wafer 101 is then loaded into a tube furnace with a pure nitrogen atmosphere at atmospheric pressure and heated to about 950° C. for about sixty minutes. The doped polysilane film 102 on the lightly doped p-type silicon wafer 101 crystallizes during the anneal process. Phosphorus dopants diffuse into the lightly doped p-type silicon wafer 101 under the doped polysilane film 102 to form a p-n junction about 0.8 microns below the doped polysilane film 102.

In another manufacturing process, the surface 101a of a p-type substrate wafer 101 is textured by wet chemical etching. The substrate wafer 101 is then transferred to an inert ambient environment and the doped polysilane liquid precursor is deposited to form a doped polysilane film 102 on the substrate wafer 101 by screen printing. The screen print pattern is in the shape of fingers and bus bars, similar to the metal finger and bus bar pattern, but with slightly larger dimensions. The reason for making it larger is that in a later step, the metal contacts 109 must be printed onto the doped polysilane film 102 only, and not overlap onto the area on the substrate wafer 101 to be lightly doped. The doped polysilane film 102 on the substrate wafer 101 is then cured by ultraviolet light or by heating to more than 400° C. before being loaded into a furnace. The furnace is heated to a high temperature to diffuse dopants out of the doped polysilane film 102 into the substrate wafer 101. A deposition of a phosphorus glass from POC13 in the presence of oxygen is performed to create the diffusion source for the lightly diffused emitter. The substrate wafer 101 with phosphorus glass is then annealed in order to diffuse dopants out of the phosphorus glass and continue to diffuse dopants out of the polysilane film 102. The substrate wafer 101 is then unloaded from the furnace, and the oxide is stripped off in hydrofluoric acid. A silicon nitride layer 108 is then deposited onto the heavily diffused region 106, for example, an emitter region, of the substrate wafer 101. A silver ink is then screen printed on top of the polysilane film 102 which is visible due to a different surface morphology compared to the remaining substrate wafer 101. The ink is dried. Aluminum paste and silver paste soldering pads are screen printed onto the rear and dried. The metals are then heated in a belt furnace where the aluminum alloys with the rear surface to produce a heavily aluminum diffused region 106 or layer and the silver paste on the front punches through the silicon nitride layer 108 and contacts the heavily doped crystallized polysilane film 105 or the heavily diffused emitter region 106.

Enumerated herein are examples for selectively diffusing dopants into the substrate wafer 101.

Example 1

A doped liquid precursor is locally deposited on the substrate wafer 101 to create a local area doped polysilane film 102 on the surface 101a. The substrate wafer 101 with the doped polysilane film 102 is heated to diffuse the dopants into the substrate wafer 101 to create a heavily diffused region 106 in the substrate wafer 101 as exemplarily illustrated in FIGS. 4-8. Subsequently, the substrate wafer 101 may be further processed to create a lightly diffused region 107 in the substrate wafer 101 as exemplarily illustrated in FIGS. 5-8.

Example 2

A lightly diffused region 107 is created in the substrate wafer 101 by performing a light diffusion step. A doped liquid precursor is locally deposited on the surface 101a of the substrate wafer 101 to create a doped polysilane film 102 on the surface 101a of the substrate wafer 101 as exemplarily illustrated in FIG. 1. The doped polysilane film 102 is heated to diffuse the dopants into the substrate wafer 101 to create a heavily diffused region 106 in the substrate wafer 101 as exemplarily illustrated in FIGS. 4-8.

Example 3

A doped liquid precursor is deposited on the substrate wafer 101 to create a doped polysilane film 102 on the surface 101a of the substrate wafer 101 as exemplarily illustrated in FIG. 1. The doped polysilane film 102 is selectively cured, for example, with ultraviolet light, to create a selectively cured doped polysilane film 103 comprising cured regions 103a and uncured regions 103b as exemplarily illustrated in FIG. 2. The selectively cured doped polysilane film 103 is selectively oxidized to create a selectively oxidized doped polysilane film 104 comprising oxidized uncured regions 104b and a non-oxidized cured region 104a as exemplarily illustrated in FIG. 3. The oxidized uncured regions 104b are removed. The non-oxidized cured region 104a of the selectively oxidized doped polysilane film 104 is heated to diffuse the dopants into the substrate wafer 101 to create a heavily diffused region 106 in the substrate wafer 101 as exemplarily illustrated in FIGS. 4-8. Subsequently, the substrate wafer 101 may be further processed create a lightly diffused region 107 in the substrate wafer 101 as exemplarily illustrated in FIGS. 5-8.

Example 4

A doped liquid precursor is deposited on the surface 101a of the substrate wafer 101 to create a doped polysilane film 102 on the surface 101a of the substrate wafer 101 as exemplarily illustrated in FIG. 1. The doped polysilane film 102 is selectively cured, for example, with ultraviolet light, to create a selectively cured doped polysilane film 103 comprising cured regions 103a and uncured regions 103b, as exemplarily illustrated in FIG. 2. The selectively cured doped polysilane film 103 is selectively oxidized to create a selectively oxidized doped polysilane film 104 comprising oxidized uncured regions 104b and a non-oxidized cured region 104a as exemplarily illustrated in FIG. 3. The selectively oxidized doped polysilane film 104 is heated to simultaneously create a heavily diffused region 106 and a lightly diffused region 107 as exemplarily illustrated in FIGS. 5-8. The oxidized uncured regions 104b of the selectively oxidized doped polysilane film 104 creates the lightly diffused region 107, while the non-oxidized cured region 104a of the selectively oxidized doped polysilane film 104 creates the heavily diffused region 106.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

The invention claimed is:

1. A method for selectively diffusing dopants into a substrate wafer, the method comprising:
   blanket depositing a doped liquid precursor including dopants on a surface of the substrate wafer to create a doped film on the surface of the substrate wafer;
   selectively forming a diffusion source in the doped film to selectively diffuse the dopants into the substrate wafer, wherein the doped film is selectively cured by patterned irradiation to provide an uncured region and a cured region in the doped film; and
   heating the doped film on the substrate wafer, wherein said heating the doped film diffuses the dopants from the doped film into the substrate wafer.

2. The method of claim 1, wherein said selectively forming a diffusion source comprises selectively curing the doped film on the surface of the substrate wafer.

3. The method of claim 1, wherein diffusion of the dopants from the doped film into the substrate wafer comprises simultaneous creation of heavily-diffused regions and lightly-diffused regions on the substrate wafer.

4. The method of claim 1, further comprising:
   creating a lightly-diffused region in the substrate wafer after said blanket depositing a doped liquid precursor.

5. The method of claim 1, further comprising:
   creating a lightly-diffused region in the substrate wafer prior to said blanket depositing a doped liquid precursor.

6. The method of claim 1, further comprising:
   heating the selectively-cured doped film to convert the selectively-cured doped film into silicon compounds.

7. The method of claim 1, further comprising:
   selectively oxidizing the selectively-cured doped film to create non-oxidized cured regions and oxidized uncured regions of the selectively-cured doped film.

8. The method of claim 1, wherein the dopants are one of positive-type impurities or negative-type impurities.

9. The method of claim 1, wherein said blanket depositing a doped liquid precursor is performed by one or more of ink-jet printing, screen printing, condensing, pneumatic spraying, ultrasonic spraying, electrospraying, spraying by liquid ejection from an orifice, spraying by direct injection of droplets of the doped liquid precursor impinging on the substrate wafer, spin coating, roller coating, bar coating, curtain coating, dip coating, or bar coating.

10. The method of claim 1, further comprising:
    doping a liquid precursor with dopants to form the doped liquid precursor.

11. The method of claim 1, wherein the doped liquid precursor is photo-sensitive and heat-sensitive.

12. A method for selectively diffusing dopants into a substrate wafer, the method comprising:
    blanket depositing a doped liquid precursor including dopants on a surface of the substrate wafer to create a doped film on the surface of the substrate wafer, wherein the liquid precursor is selected from the group consisting of monomers, polymers, and oligomers of silicon and hydrogen;

selectively forming a diffusion source in the doped film to selectively diffuse the dopants into the substrate wafer by forming an uncured region and a cured region in the doped film; and heating the doped film on the substrate wafer, wherein said heating the doped film diffuses the dopants from the doped film into the substrate wafer.

13. A method for selectively diffusing dopants into a substrate wafer, the method comprising:

blanket depositing a doped liquid precursor including dopants on a surface of the substrate wafer to create a doped film on the surface of the substrate wafer, wherein the liquid precursor is one or more of a silane, an oligosilane, or a polysilane, with one or more of linear, branched, or particulate structures;

selectively forming a diffusion source in the doped film to selectively diffuse the dopants into the substrate wafer by forming an uncured region and a cured region in the doped film; and heating the doped film on the substrate wafer, wherein said heating the doped film diffuses the dopants from the doped film into the substrate wafer.

* * * * *